United States Patent
Wada

(10) Patent No.: US 10,677,445 B2
(45) Date of Patent: Jun. 9, 2020

(54) IMAGING DEVICE

(71) Applicant: Panasonic Intellectual Property Management Co., Ltd., Osaka (JP)

(72) Inventor: Shinichi Wada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/477,206

(22) PCT Filed: Jan. 12, 2018

(86) PCT No.: PCT/JP2018/000601
§ 371 (c)(1),
(2) Date: Jul. 11, 2019

(87) PCT Pub. No.: WO2018/135398
PCT Pub. Date: Jul. 26, 2018

(65) Prior Publication Data
US 2019/0346126 A1 Nov. 14, 2019

(30) Foreign Application Priority Data
Jan. 20, 2017 (JP) ................. 2017-008695

(51) Int. Cl.
*B60Q 1/06* (2006.01)
*F21V 29/00* (2015.01)
(Continued)

(52) U.S. Cl.
CPC .............. *F21V 29/76* (2015.01); *B60Q 3/233* (2017.02); *F21V 29/503* (2015.01); *H01L 23/367* (2013.01)

(58) Field of Classification Search
CPC .......... B60Q 3/20; B60Q 3/233; B60R 11/04; F21V 29/503; F21V 29/70;
(Continued)

(56) References Cited

U.S. PATENT DOCUMENTS

2009/0290346 A1  11/2009  Ogawa et al.
2012/0224372 A1   9/2012  Ogawa et al.
(Continued)

FOREIGN PATENT DOCUMENTS

JP  2005-150132  6/2005
JP  2013-101951  5/2013
(Continued)

OTHER PUBLICATIONS

International Search Report of PCT application No. PCT/JP2018/000601 dated Apr. 3, 2018.

*Primary Examiner* — Jason M Han
(74) *Attorney, Agent, or Firm* — Greenblum & Bernstein, P.L.C.

(57) ABSTRACT

An imaging device includes an LED element mounted on a surface of an LED substrate and electrically connected to a wiring pattern. For the surface of the LED substrate, a heatsink for dissipating heat of the LED substrate is arranged to face the surface of the LED substrate on which surface the LED element is mounted. The heatsink includes: a base portion attached in a manner allowing heat transfer in which a heat transfer surface of the base portion faces the surface of the LED substrate, the base portion allowing the illumination light from the LED element to pass through the base portion; and fins integrally protruding from the heat dissipating surface, being arranged spaced from each other, and being cooled by air that is naturally convected.

8 Claims, 15 Drawing Sheets

(51) Int. Cl.
   *F21V 29/76*   (2015.01)
   *F21V 29/503*  (2015.01)
   *B60Q 3/233*   (2017.01)
   *H01L 23/367*  (2006.01)

(58) Field of Classification Search
   CPC ............ F21V 29/74–777; F21V 33/00; H01L 23/36–40; H04N 5/225; H05K 7/20
   USPC ........................... 362/249.02, 259, 294, 373
   See application file for complete search history.

(56) References Cited

U.S. PATENT DOCUMENTS

| | | |
|---|---|---|
| 2013/0207566 A1 | 8/2013 | Sawada et al. |
| 2015/0098235 A1 | 4/2015 | Singh et al. |
| 2015/0186737 A1 | 7/2015 | Omi et al. |
| 2015/0237246 A1 | 8/2015 | Omi |

FOREIGN PATENT DOCUMENTS

| | | |
|---|---|---|
| JP | 2013-164571 | 8/2013 |
| JP | 2014-027408 | 2/2014 |
| JP | 2014-067728 | 4/2014 |
| JP | 2014-075637 | 4/2014 |
| JP | 2015-076275 | 4/2015 |
| JP | 2016-107731 | 6/2016 |

US 10,677,445 B2

IMAGING DEVICE

CROSS-REFERENCE TO RELATED APPLICATIONS

This application is a U.S. national stage application of the PCT International Application No. PCT/JP2018/000601 filed on Jan. 12, 2018, which claims the benefit of foreign priority of Japanese patent application 2017-008695 filed on Jan. 20, 2017, the contents all of which are incorporated herein by reference.

TECHNICAL FIELD

The present invention relates to an imaging device, particularly to an imaging device for monitoring a state of a passenger sitting on a seat of a vehicle.

BACKGROUND ART

Heretofore, as an example of the imaging device of this type, there has been known the technique disclosed in PTL 1. PTL 1 discloses an imaging device including a substrate, an imaging unit, and left and right paired light emitting diode (LED) elements. The substrate has a surface on which wiring is formed. The imaging unit is mounted on the surface of the substrate at a location that is a center of the surface of the substrate when viewed in a left-right direction, and the imaging unit is electrically connected to the substrate. The LED elements are mounted on the surface of the substrate such that the LED elements are arranged on left and right sides of the imaging unit and are away from the imaging unit by a certain distance. The LED elements are electrically connected to the substrate.

PTL 2 discloses a head-up display device configured to project a display image onto a windshield of a vehicle. The head-up display device includes a substrate having a surface on which wiring is formed, a pair of LED elements mounted on the surface of the substrate and electrically connected to the substrate, and a heatsink having a front surface being in contact with and fixed to a back surface of the substrate. The heatsink is provided for the purpose of dissipating heat of the substrate. The heatsink includes a base portion whose front surface has a flat shape and fins integrally protruding from a rear surface of the base portion and being spaced from each other.

CITATION LIST

Patent Literature

PTL 1: Unexamined Japanese Patent Publication No. 2014-27408
PTL 2: Unexamined Japanese Patent Publication No. 2016-107731

SUMMARY OF THE INVENTION

An object of the present invention is to provide a highly reliable operation environment for an imaging device even when a substrate is heated to a high temperature, by efficiently dissipating the heat of the substrate caused by a light-emitting element.

In order to achieve the above object, an imaging device according to one exemplary embodiment of the present invention includes an imaging unit, a substrate, a light-emitting element, and a heatsink. The substrate has a surface on which a predetermined wiring pattern is formed. The light-emitting element is mounted on the surface of the substrate, and is electrically connected to the wiring pattern. The light-emitting element is configured to emit illumination light in an imaging direction of the imaging unit. The heatsink is arranged to face the surface of the substrate on which surface the light-emitting element is mounted. The heatsink is configured to dissipate heat of the substrate. The heatsink includes: a base portion attached in a manner allowing heat transfer in which a heat transfer surface of the base portion faces the surface of the substrate, the base portion allowing the illumination light from the light-emitting element to pass through the base portion; and fins integrally protruding from a heat dissipating surface, being spaced from each other, and being cooled by air.

With the heatsink of the present invention, the heat on the surface of the substrate caused by the light-emitting element can be dissipated not via the substrate but through the fins. Specifically, the heat on the surface of the substrate is transferred from the heat transfer surface of the base portion to the fins, which are provided on the heat dissipating surface of the base portion of the heatsink, so that the heat is dissipated through the fins. Consequently, according to the present invention, it is possible to efficiently dissipate the heat on the substrate caused by the light-emitting element, thereby providing a highly reliable operation environment even when the substrate is heated to a high temperature.

DESCRIPTION OF EMBODIMENTS

Figure 1:
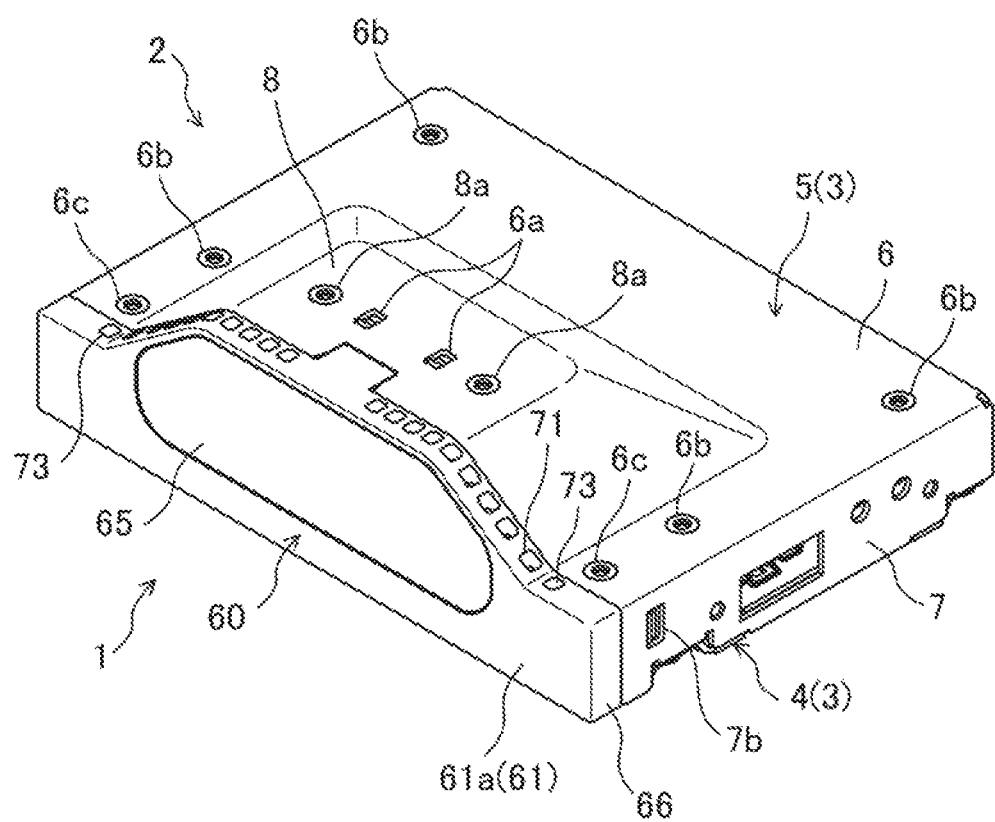
FIG. 1 is an overall perspective view of an imaging device according to an exemplary embodiment of the present invention, viewed from above.
Figure 2:
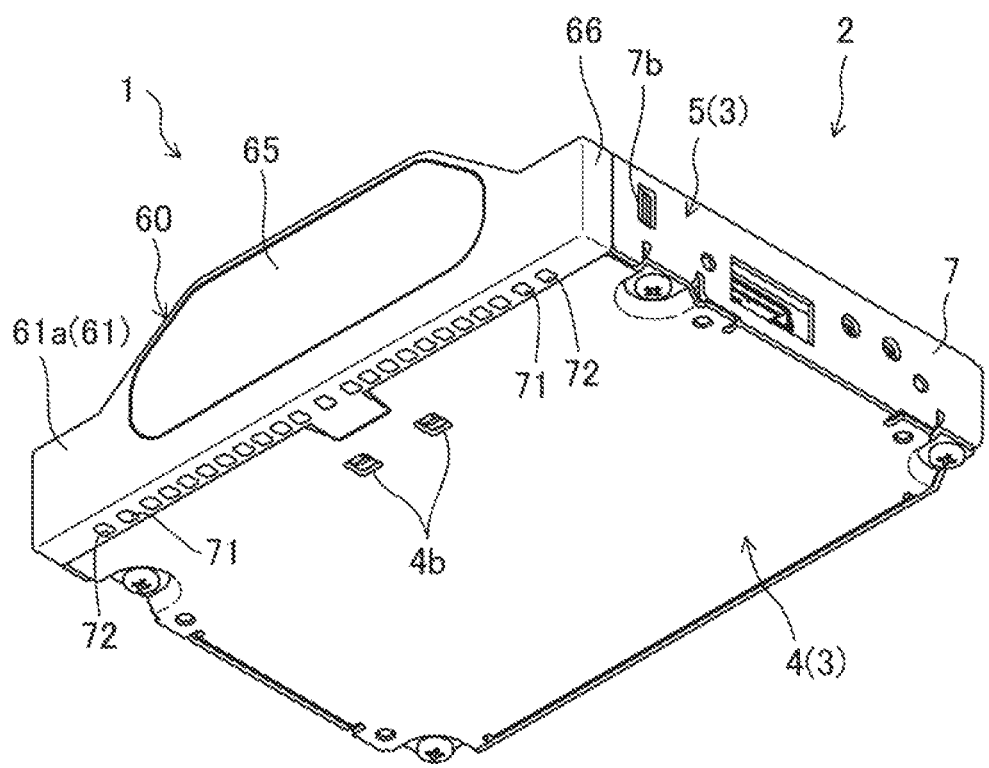
FIG. 2 is an overall perspective view of the imaging device, viewed from below.
Figure 3:
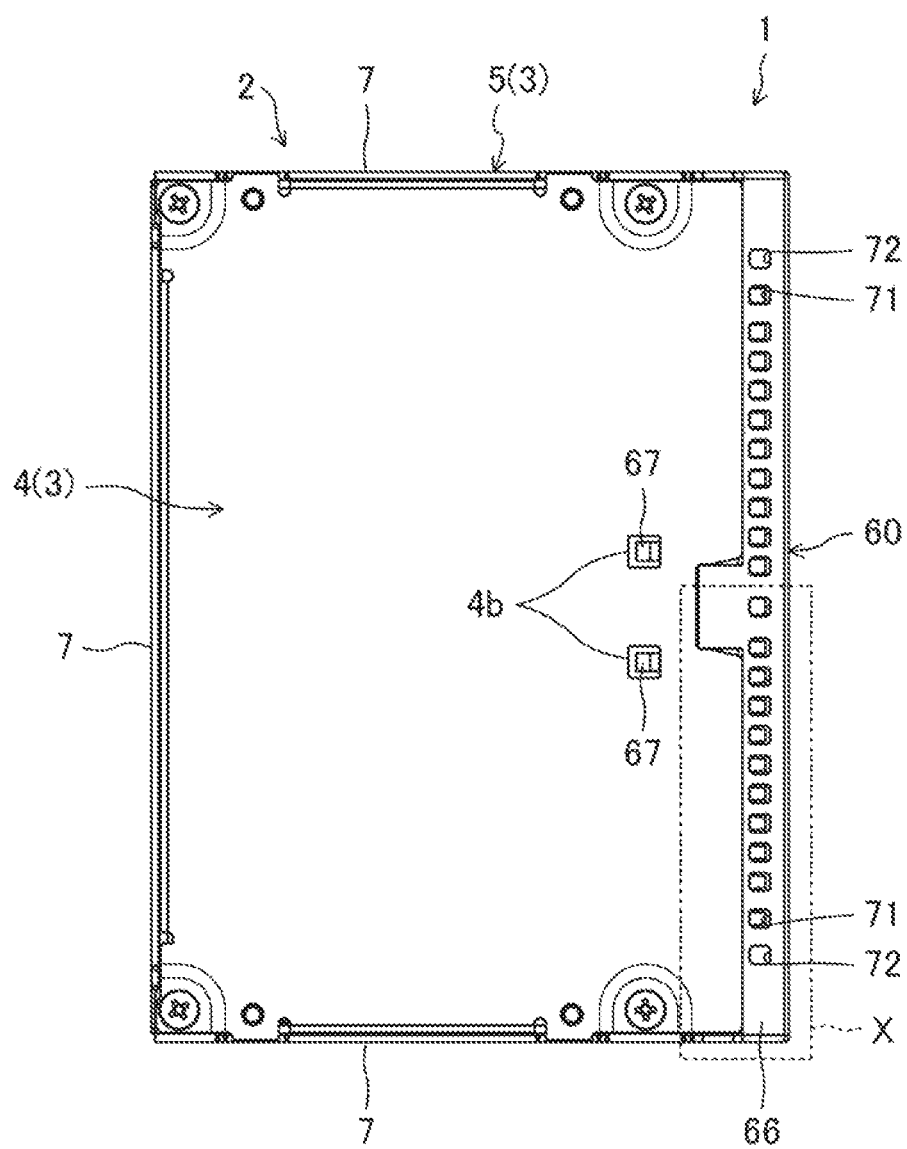
FIG. 3 is a bottom view of the imaging device.
Figure 4:
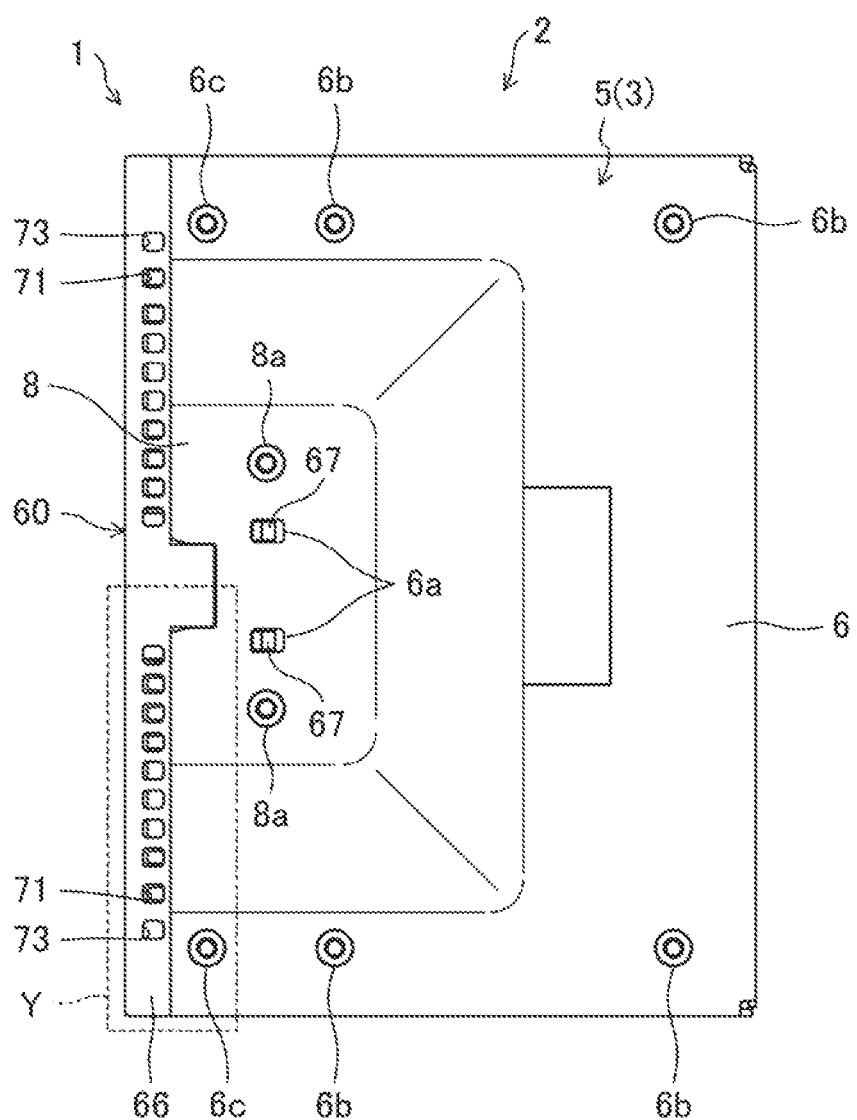
FIG. 4 is a plan view of the imaging device.

Prior to description of exemplary embodiments of the present invention, simple description of problems of the conventional devices will be given. According to the imaging device of PTL 1, the LED elements are configured to emit illumination light to an imaging region of the imaging unit. While the LED elements are emitting the illumination light, the LED elements generate heat due to electric power consumed by the LED elements. The heat thus generated is transferred to the surface of the substrate on which surface the LED elements are mounted. However, the imaging device of PTL 1 cannot appropriately dissipate the heat of the substrate caused by the LED elements since the imaging device of PTL 1 is not provided with the heatsink disclosed by PTL 2.

Here, assume that the heatsink of PTL 2 is applied to the imaging device of PTL 1. In such a case, the heatsink is fixed to the imagine apparatus in a similar manner to PTL 2 such that the front surface of the base portion of the heatsink is in contact with a back surface of the substrate, on which back surface the LED elements are not mounted. With such a configuration, however, heat transfer from the surface of the substrate to the fins of the heatsink, which is disposed to face the back surface of the substrate, is necessarily conducted via the substrate made of a resin material, which typically has low heat conductivity. Namely, even with the configuration in which the heatsink of PTL 2 is applied to the imaging device of PTL 1, the heat of the substrate caused by the LED elements cannot be dissipated efficiently. Thus, it is impossible to maintain a suitable operation environment for the imaging device when the substrate is heated to a high temperature, disadvantageously.

With reference to the drawings, the following describes an exemplary embodiment of the present invention in detail. The following description of the exemplary embodiment is substantially made merely by way of example, and is not intended to limit the present invention, application of the present invention, and use of the present invention.

FIGS. 1 to 4 illustrate entire imaging device 1 according to the exemplary embodiment of the present invention. Imaging apparatus 1 is a device that is to be mounted on a vehicle to monitor a state of a passenger sitting on a seat of the vehicle. For example, imaging device 1 is installed on a steering column in an automobile.

In the following description, with reference to FIGS. 6 to 9, a positional relation in a front-rear direction of imaging device 1 will be expressed assuming that surface 20a of LED substrate 20 (described later) is located on a front side (forward) and back surface 20b of LED substrate 20 is located on a rear side (rearward). Note that this positional relation does not necessarily correspond to a front-rear direction of imaging device 1 actually installed in a vehicle (automobile).

(Imaging Unit)

Imaging apparatus 1 includes imaging unit 2 for monitoring a state of a passenger sitting on a seat of the vehicle. Imaging unit 2 includes housing 3, main substrate 10, and camera unit 11 as main element members.

Figure 5:
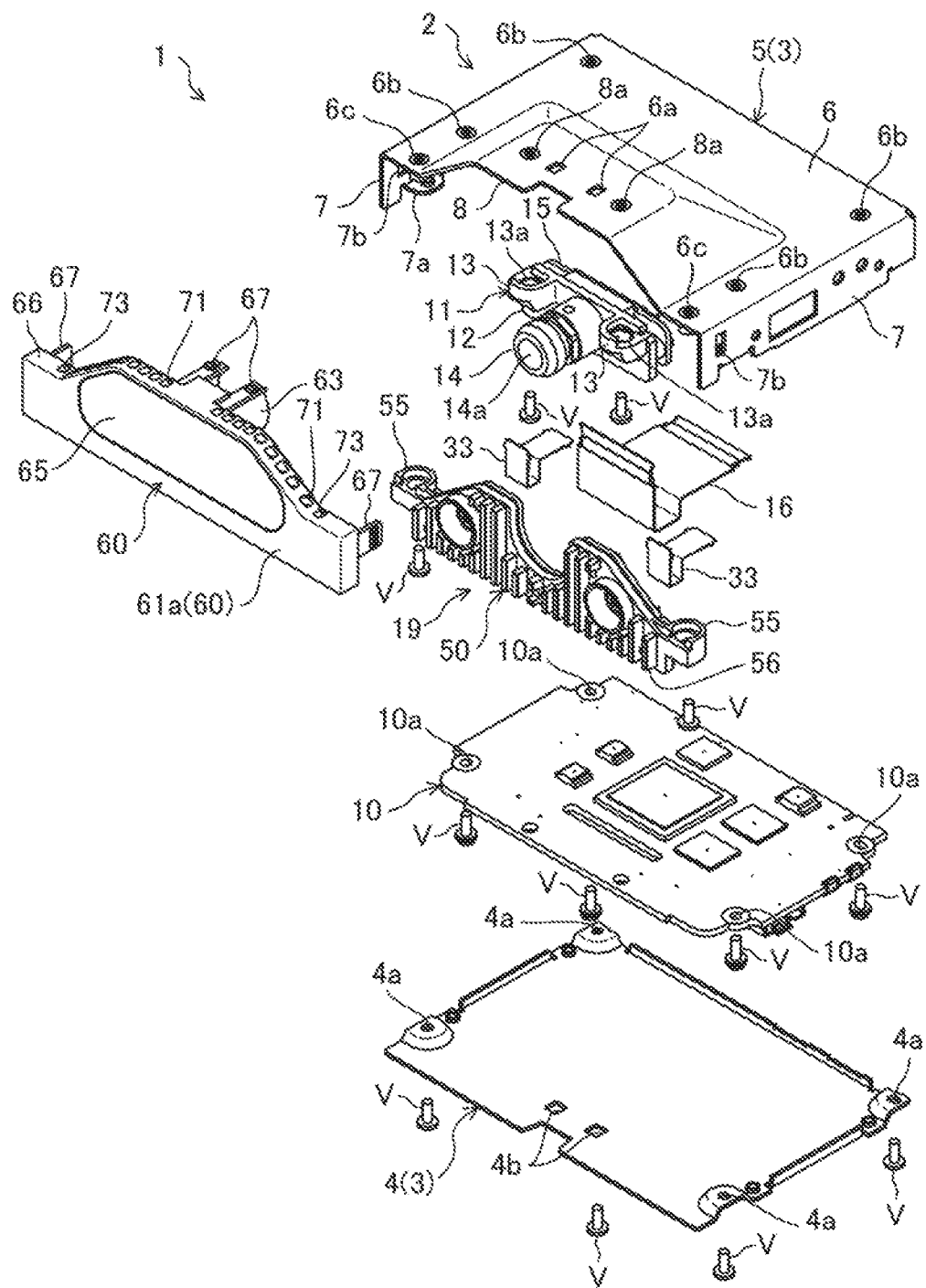
FIG. 5 is an exploded perspective view of the imaging device.

As illustrated in FIGS. 1 to 4, housing 3 is made of a metal material such as aluminum, for example. Housing 3 serves as a casing of imaging device 1. Specifically, as illustrated in FIG. 5, housing 3 has bottom plate 4 and upper lid 5. In addition, in a state where bottom plate 4 is fixed to upper lid 5, a front side of housing 3 is entirely opened to form a front opening.

Bottom plate 4 has a substantially rectangular plate shape in a plan view. Bottom plate 4 has corners respectively having screw insertion holes 4a through which screws V are to be inserted. In addition, bottom plate 4 has engagement holes 4b at locations being close to a front side of bottom plate 4 and being in a substantial center of bottom plate 4 when viewed in a left-right direction. Engagement holes 4b are to be engaged with claws 67 of cover member 60 (described later).

Upper lid 5 has top board 6 having a substantially rectangular shape in a plan view and side walls 7 extending downwardly from left and right sides and a rear side of top board 6. Each of side walls 7 extending from the left and right sides of top board 6 has screw tightening portions 7a (only a single screw tightening portion 7a is illustrated in FIG. 5) at locations close to front and rear sides of side wall 7. Via screw tightening portions 7a, screws V inserted into screw insertion holes 4a of bottom plate 4 are tightened. In addition, top board 6 has engagement holes 6a at locations being close to a front side of top board 6 and being in a substantial center of top board 6 when viewed in the left-right direction. Engagement holes 6a are to be engaged with claws 67 of cover member 60 (described later). Furthermore, each of side walls 7 extending from the left and right sides of top board 6 also has engagement hole 7b at a location close to the front side of side wall 7. Similarly to engagement holes 6a of top board 6, engagement holes 7b are to be engaged with claws 67 of cover member 60.

Top board 6 has screw tightening portions 6b at locations close to the left and right sides of top board 6. Via screw tightening portions 6b, screws V are tightened so that main substrate 10 is fixed to top board 6. In addition, top board 6 has screw tightening portions 6c at locations close to the front side of top board 6 and to the left and right sides of top board 6. Via screw tightening portions 6c, screws V are tightened so that heatsink 50 (described later) is fixed to top board 6.

Top board 6 has, at a location close to the front side of top board 6, camera accommodation portion 8 via which camera unit 11 is accommodated in housing 3. Camera accommodation portion 8 is made of a portion of top board 6, the portion being close to the front side of top board 6 and in a substantially center of top board 6 when viewed in the left-right direction, the portion protruding upward from top board 6 in a substantially trapezoid shape. Camera accommodation portion 8 has screw tightening portions 8a in a top portion of camera accommodation portion 8. Via screw tightening portions 8a, screws V are tightened so that camera unit 11 is fixed to camera accommodation portion 8.

Main substrate 10 is electrically connected both to camera unit 11 and LED unit 19 (described later). As illustrated in FIG. 5, main substrate 10 has a substantially rectangular shape in a plan view, and has corners through which screw insertion holes 10a penetrate in a top-bottom direction. By use of screw insertion holes 10a, main substrate 10 is fixed to top board 6. Main substrate 10 is attached to upper lid 5 by tightening, to screw tightening portions 6b of top board 6, screws V inserted into screw insertion holes 10a upwardly.

As illustrated in FIG. 5, camera unit 11 has unit body 12. Unit body 12 is made of die-cast aluminum, for example. Unit body 12 has left and right sides respectively provided with attachment portions 13 via which camera unit 11 is attached to camera accommodation portion 8 of upper lid 5. Through attachment portions 13, screw insertion holes 13a penetrate in the top-bottom direction, respectively. Screws V are to be inserted into screw insertion holes 13a. Camera unit 11 is attached to camera accommodation portion 8 of upper lid 5 by tightening, to screw tightening portions 8a of camera accommodation portion 8, screws V inserted into screw insertion holes 13a from a bottom side of unit body 12.

Unit body 12 has, in a center of unit body 12 when viewed in the left-right direction, lens portion 14 having a cylindrical shape. Lens portion 14 is arranged such that lens surface 14a, which is provided at a distal end of lens portion 14, faces lens through-hole 62 (see FIG. 11) of cover member 60 (described later). Camera substrate 15 is disposed behind unit body 12. Camera substrate 15 is electrically connected to main substrate 10 via flat cable 16.

(Led Unit)

Figure 6:
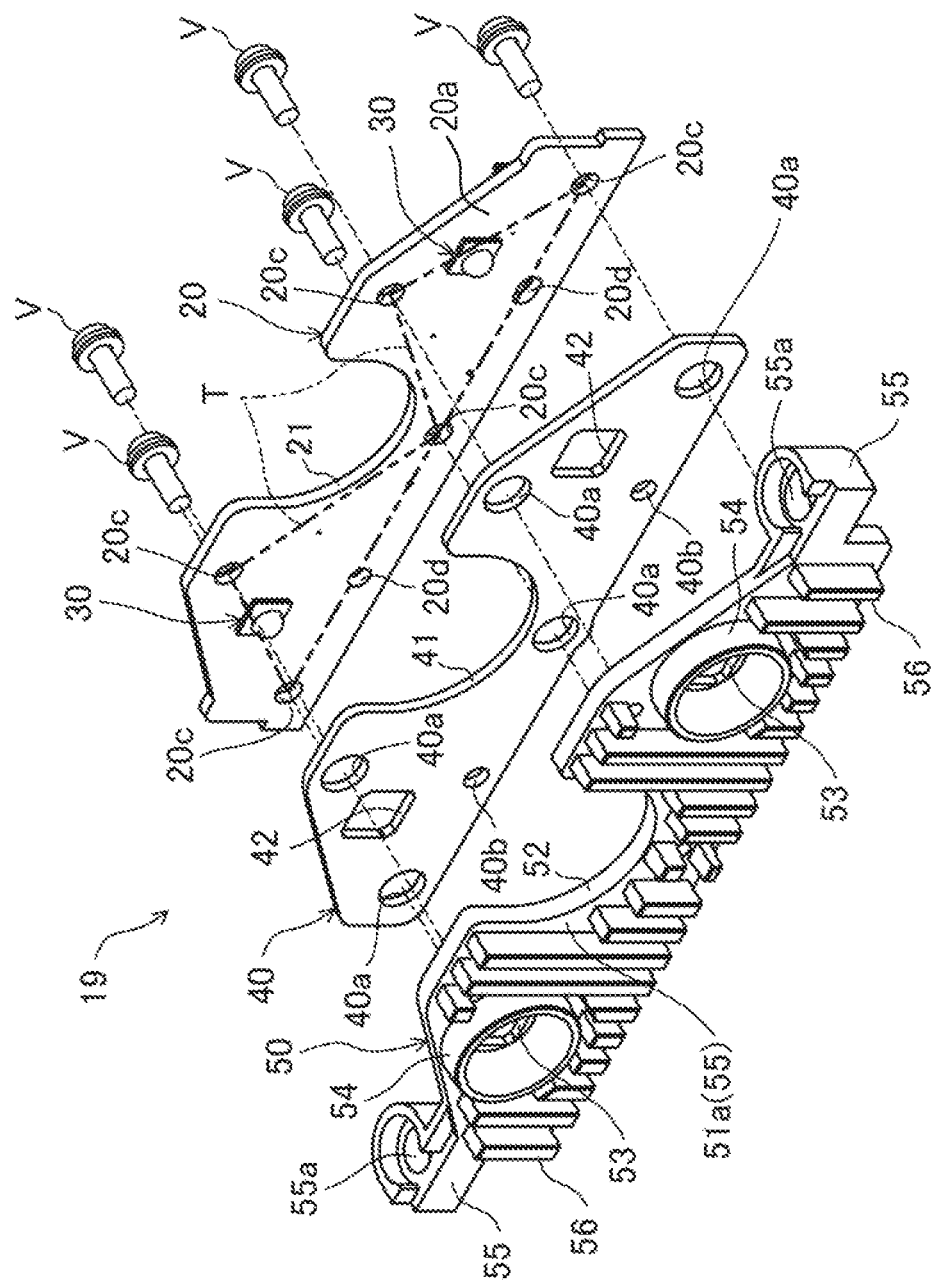
FIG. 6 is an exploded perspective view of an LED unit, viewed from a front side.
Figure 7:
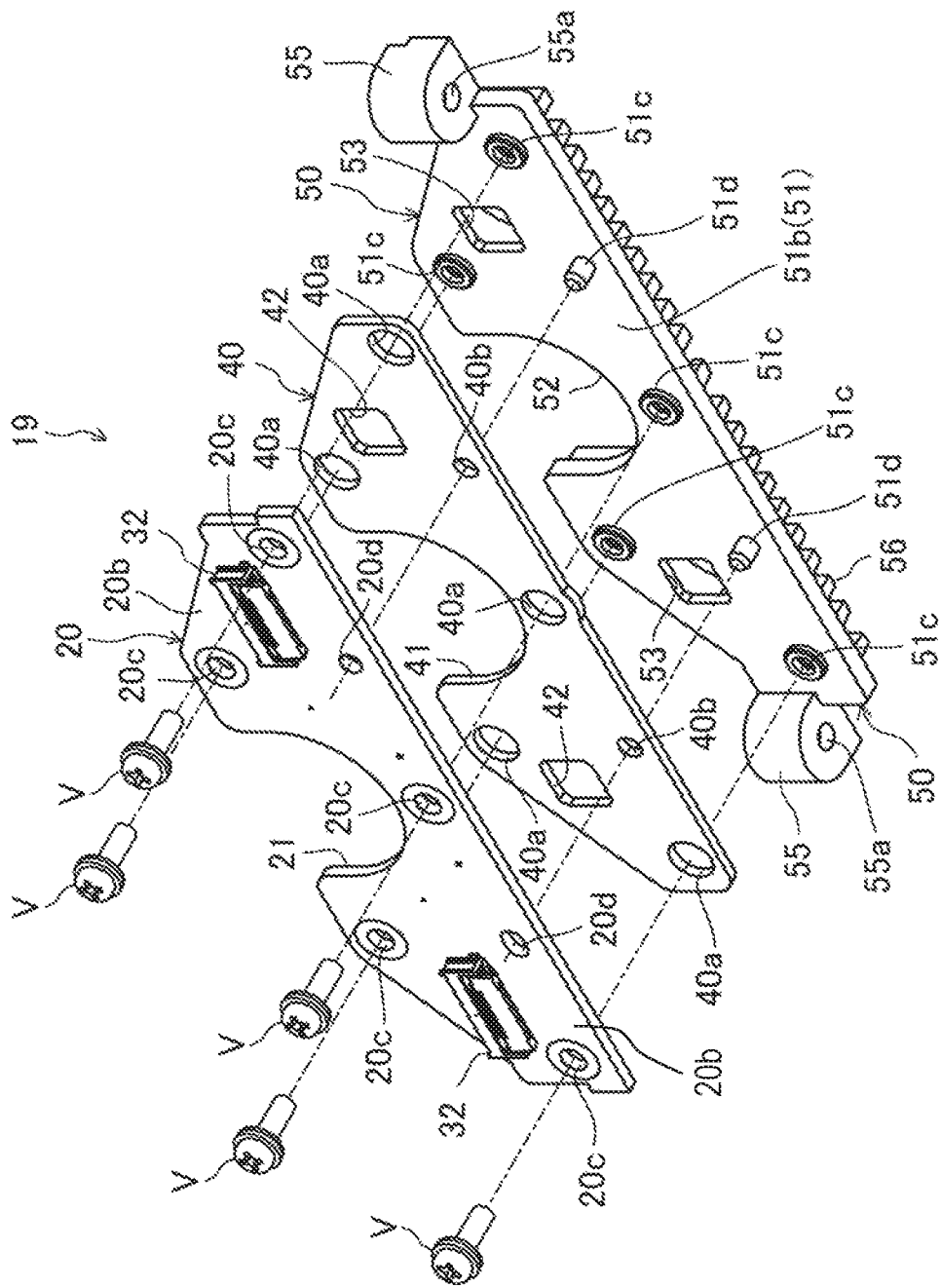
FIG. 7 is an exploded perspective view of the LED unit, viewed from a rear side.

As illustrated in FIG. 5, imaging device 1 includes LED unit 19 for emitting illumination light to an imaging region that is to be imaged by camera unit 11 of imaging unit 2. As illustrated in FIGS. 6 and 7, LED unit 19 includes LED substrate 20 (substrate), LED elements 30 (light-emitting elements), heat dissipating sheet 40, and heatsink 50 as main element members.

LED substrate 20 is arranged in housing 3 such that surface 20a of LED substrate 20 faces a front side of imaging device 1. LED substrate 20 has upper left and right corners chamfered. This allows an outer periphery of LED substrate 20 to be accommodated in the front opening of housing 3 in a front view.

LED substrate 20 has, in a center of LED substrate 20 when viewed in the left-right direction, notched recessed portion 21 that is recessed in a substantially circular-arc shape from an upper end of LED substrate 20. Notched recessed portion 21 outwardly fits a lower side of lens portion 14 of camera unit 11 fixed to camera accommodation portion 8 of upper lid 5, so that notched recessed portion 21 can hold lens portion 14.

LED substrate 20 has, at predetermined positions, screw insertion holes 20c penetrating through LED substrate 20 in the front-rear direction. In addition, LED substrate 20 has, in a lower portion of LED substrate 20, positioning holes 20d penetrating through LED substrate 20 in the front-rear direction and being spaced from each other in the left-right direction. Positioning holes 20d are arranged at locations where positioning holes 20d are respectively aligned to positioning projections 51d of heatsink 50 (described later).

Figure 8:
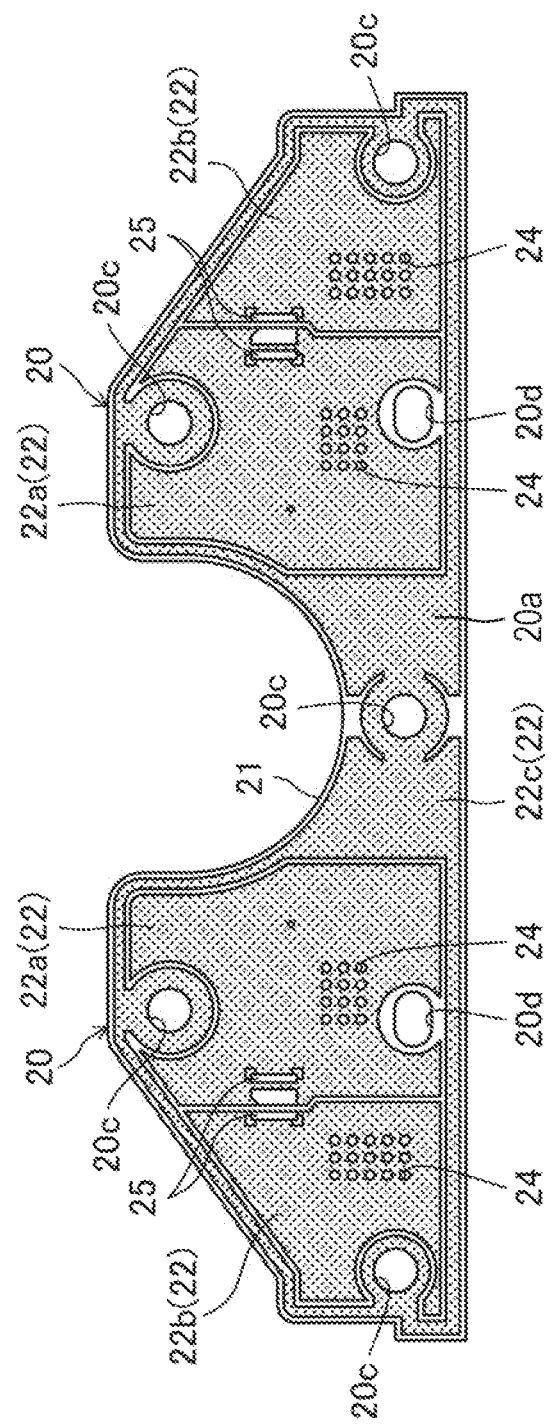
FIG. 8 is a front view of an LED substrate.

As illustrated in FIG. 8, predetermined wiring pattern 22 made of copper foil is formed on surface 20a of LED substrate 20. Specifically, wiring pattern 22 includes anode and cathode planar patterns 22a, 22b, ... formed in a plane shape extending along surface 20a of LED substrate 20. Anode planar patterns 22a are respectively arranged on left and right sides of notched recessed portion 21. Cathode planar patterns 22b are respectively arranged at locations being close to left and right sides of LED substrate 20 and being adjacent to corresponding anode planar patterns 22a.

Figure 9:
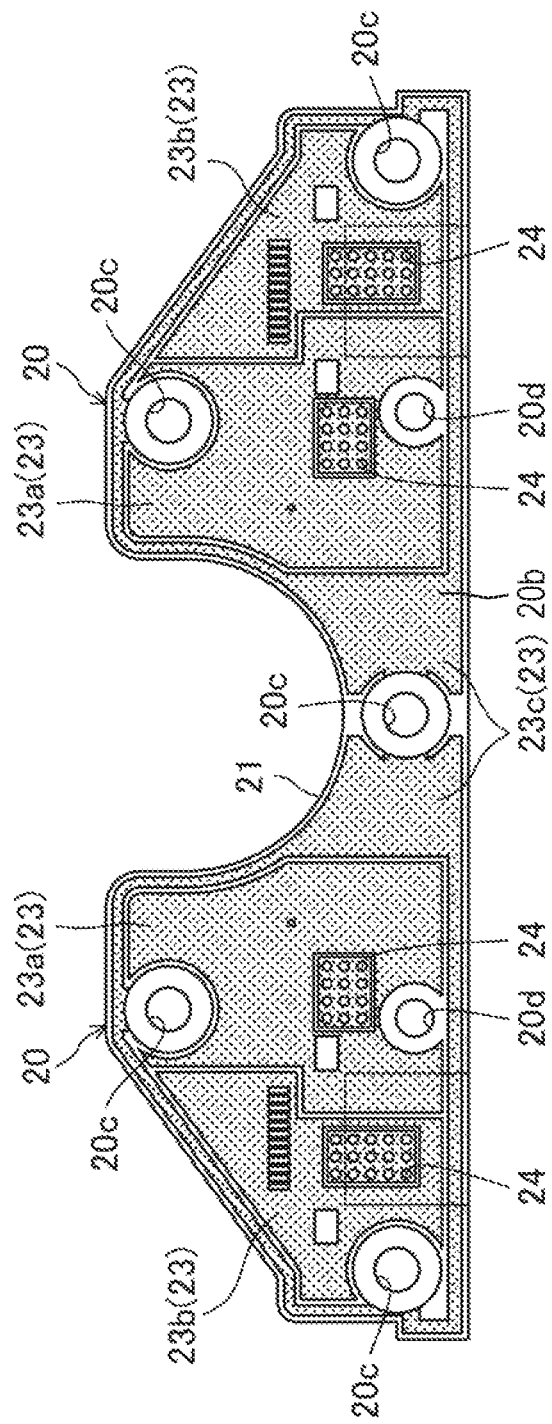
FIG. 9 is a rear view of the LED substrate.

As illustrated in FIG. 9, predetermined wiring pattern 23 is formed also on back surface 20b of LED substrate 20. Specifically, wiring pattern 23 includes anode and cathode planar patterns 23a, 23b, ... formed in a plane shape extending along back surface 20b of LED substrate 20. Anode planar patterns 23a are respectively arranged on left and right sides of notched recessed portion 21. Cathode planar patterns 23b are respectively arranged at locations being close to the left and right sides of LED substrate 20 and being adjacent to corresponding anode planar patterns 23a.

As illustrated in FIGS. 8 and 9, LED substrate 20 has through-holes 24 penetrating through LED substrate 20 in the front-rear direction and allowing wiring pattern 22 on surface 20a and wiring pattern 23 on back surface 20b to communicate with each other. Anode planar patterns 22a, 23a are electrically connected with each other via through-holes 24. Cathode planar patterns 22b, 23b are also electrically connected with each other via through-holes 24.

On surface 20a of LED substrate 20, ground planar pattern 22c is formed. Also on back surface 20b of LED substrate 20, ground planar patterns 23c are formed. Each of ground planar patterns 22c, 23c is formed in a planar shape including the positions of screw insertion holes 20c.

Note that FIG. 6 does not illustrate planar patterns 22a, 22b, 22c and through-holes 24. In a similar manner to FIG. 6, FIG. 7 does not illustrate planar patterns 23a, 23b, 23c and through-holes 24. In FIG. 8, planar patterns 22a, 22b, 22c are hatched with dots in order to illustrate planar patterns 22a, 22b, 22c in a highlighted manner. In FIG. 9, planar patterns 23a, 23b, 23c are hatched with dots in a similar manner to FIG. 8.

As illustrated in FIGS. 6 and 7, LED elements 30 are configured to emit illumination light toward the front side of imaging device 1, i.e., in an imaging direction of imaging unit 2. LED elements 30 are arranged on surface 20a of LED substrate 20, and are spaced from each other in the left-right direction. More specifically, each of LED elements 30 is positioned within region T (see FIG. 6) surrounded by three screw insertion holes 20c of LED substrate 20.

As illustrated in FIG. 6, LED elements 30 are surface-mounted on lands 25 provided to planar patterns 22a, 22b of wiring pattern 22 illustrated in FIG. 8. Thus, LED elements 30 are electrically connected to wiring pattern 22. Consequently, LED elements 30 are electrically connected to planar patterns 22a, 22b on surface 20a of LED substrate 20. Meanwhile, as illustrated in FIG. 7, connection portions 32 are provided on back surface 20b of LED substrate 20. Connection portions 32 are electrically connected to main substrate 10 via flexible flat cables 33 (see FIG. 5).

As illustrated in FIGS. 6 and 7, heat dissipating sheet 40 is formed in a thin film shape, and has a heat dissipating property and an insulation property. Heat dissipating sheet 40 is interposed between surface 20a of LED substrate 20 and rear surface 51b (heat transfer surface) (see FIG. 7) of heatsink 50 (described later). Similarly to LED substrate 20, heat dissipating sheet 40 has upper left and right corners chamfered. This allows an outer periphery of heat dissipating sheet 40 to be accommodated in the front opening of housing 3 in a front view.

Heat dissipating sheet 40 has, in a center of heat dissipating sheet 40 when viewed in the left-right direction, notched recessed portion 41 that is recessed in a substantially circular-arc shape from an upper end of heat dissipating sheet 40, in similar manner to LED substrate 20.

Heat dissipating sheet 40 has screw insertion holes 40a penetrating through heat dissipating sheet 40 in the front-rear direction and being arranged at locations where screw insertion holes 40a are respectively aligned to screw insertion holes 20c of LED substrate 20. In addition, heat dissipating sheet 40 has, in a lower portion of heat dissipating sheet 40, positioning holes 40b penetrating through heat dissipating sheet 40 in the front-rear direction and being spaced from each other in the left-right direction. In a similar manner to positioning holes 20d of LED substrate 20, positioning holes 40b are arranged at locations where positioning holes 40b are respectively aligned to positioning projections 51d of heatsink 50 (described later).

Heat dissipating sheet 40 has LED insertion holes 42 penetrating through heat dissipating sheet 40 in the front-rear direction and having a substantially rectangular shape. LED insertion holes 42 are arranged at locations which are spaced from each other in the left-right direction and in which LED insertion holes 42 are respectively aligned to LED elements 30 mounted on surface 20a of LED substrate 20.

Heatsink 50 is made of die-cast aluminum, for example. Heatsink 50 is arranged in front of LED substrate 20, i.e., at a location facing the surface of LED substrate 20 on which surface LED elements 30 are mounted. Heatsink 50 is configured to dissipate heat of LED substrate 20.

As illustrated in FIGS. 5 to 7, heatsink 50 has base portion 51 having a substantially plate shape. Base portion 51 is attached in a manner allowing heat transfer in which rear surface 51b, i.e., the heat transfer surface faces surface 20a of LED substrate 20. Specifically, rear surface 51b of base portion 51 has screw tightening portions 51c having a boss shape. Screws V inserted into screw insertion holes 20c of LED substrate 20 and screw insertion holes 40a of heat dissipating sheet 40 from the back surface 20b side of LED substrate 20 are tightened and fixed to screw tightening portions 51c of base portion 51. In this manner, rear surface 51b of base portion 51 is attached to surface 20a of LED substrate 20 via heat dissipating sheet 40.

In the state where LED substrate 20 and heat dissipating sheet 40 are fixed to heatsink 50 by tightening screws V, boss faces of screw tightening portions 51c are in contact with surface 20a of LED substrate 20 and heat dissipating sheet 40 is pressed onto the boss faces of screw tightening portions 51c. In this state, surface 20a of LED substrate 20 and rear surface 51b of base portion 51 are in close contact with each other via heat dissipating sheet 40. Consequently, warpage of LED substrate 20 toward rear surface 51b of base portion 51 is suppressed or reduced. In addition, a gap between surface 20a of LED substrate 20 and heat dissipating sheet 40 is hardly made. Furthermore, as long as LED elements 30 are positioned within regions T as described above, the above configuration can stably hold LED elements 30 to prevent float-up of LED elements 30 from LED substrate 20 and inclination of LED elements 30 relative to surface 20a of LED substrate 20.

In addition, base portion 51 has, in a lower portion of base portion 51, positioning projections 51d protruding rearward from rear surface 51b and being spaced from each other in the left-right direction. Positioning projections 51d are formed to be inserted into positioning holes 20d of LED substrate 20 and positioning holes 40b of heat dissipating sheet 40. This prevents positional shifts of LED substrate 20 and heat dissipating sheet 40 with respect to heatsink 50.

Base portion 51 has, in a center of base portion 51 when viewed in the left-right direction, notched recessed portion 52 that is recessed in a substantially circular-arc shape from an upper end of base portion 51. Similarly to notched recessed portion 21 of LED substrate 20, notched recessed portion 52 outwardly fits the lower side of lens portion 14 of camera unit 11 fixed to camera accommodation portion 8 of upper lid 5, so that notched recessed portion 52 can hold lens portion 14.

Base portion 51 has LED insertion holes 53 penetrating through base portion 51 in the front-rear direction and having a substantially rectangular shape. In a similar manner to those in heat dissipating sheet 40, LED insertion holes 53 are arranged at locations which are spaced from each other in the left-right direction and in which LED insertion holes 53 are aligned to LED elements 30 mounted on surface 20a of LED substrate 20. With base portion 51 configured as above, illumination light from LED elements 30 can pass through LED insertion holes 42 of heat dissipating sheet 40 and LED insertion holes 53 of base portion 51 so as to be directed toward the front side of imaging device 1. Base portion 51 has shielding portions 54 protruding from peripheries of respective LED insertion holes 53 on front surface 51a of base portion 51 toward the front side of imaging device 1. Shielding portions 54 have a cylindrical shape.

Base portion 51 has left and right edges respectively provided with attachment portions 55, via which LED unit 19 is attached to left and right sides of top board 6. Attachment portions 55 respectively have screw insertion holes 55a which penetrate through attachment portions 55 in the top-bottom direction and through which screws V are to be inserted. LED unit 19 is attached to upper lid 5 by tightening, to screw tightening portions 6c (see FIG. 5) of upper lid 5, screws V inserted into screw insertion holes 55a from a bottom side of base portion 51.

Figure 14:
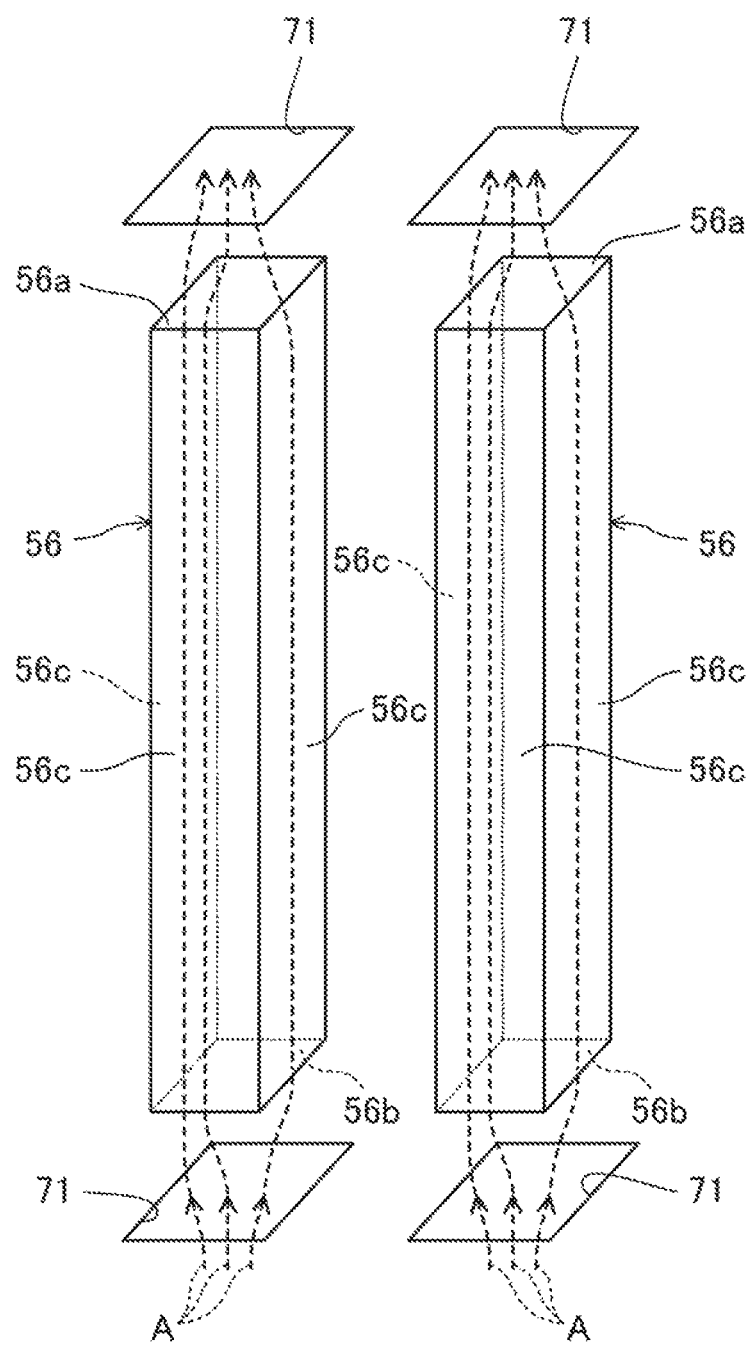
FIG. 14 is a schematic view schematically illustrating an arrangement of fins and first openings.

As illustrated in FIGS. 5 to 7, heatsink 50 has a plurality of fins 56 to achieve an increased heat-dissipating area. Fins 56 are formed integrally on front surface 51a, i.e., a heat dissipating surface of base portion 51, and fins 56 are spaced from each other. More specifically, fins 56 are shaped in a substantially quadrangular prism extending in the top-bottom direction to generate a flow of air A in the top-bottom direction along side surfaces 56c due to natural convection (see FIG. 14). Namely, as illustrated in FIG. 14, fins 56 are configured to cool heatsink 50 with air A undergone naturally convection. Heatsink 50 is arranged in housing 3 to cause, by fins 56, natural convection of air A along a direction of the opposite to gravitational force.

(Cover Member)

As illustrated in FIGS. 1 to 4, cover member 60 is provided at the front opening of housing 3. Specifically, as illustrated in FIG. 5, cover member 60 is disposed at the front opening of housing 3 and in front of heatsink 50 (i.e., in front of the heat dissipating surface) such that cover member 60 covers fins 56.

As illustrated in FIGS. 5 and 10 to 13, cover member 60 has front surface 61 which is positioned at a location facing a front side (heat dissipating surface side) of base portion 51 of heatsink 50 and being spaced from fins 56 and which has a substantially plate shape. Front surface 61 is formed to have an outer periphery having the same size and shape as those of the front opening of housing 3 in a front view.

Figure 10:
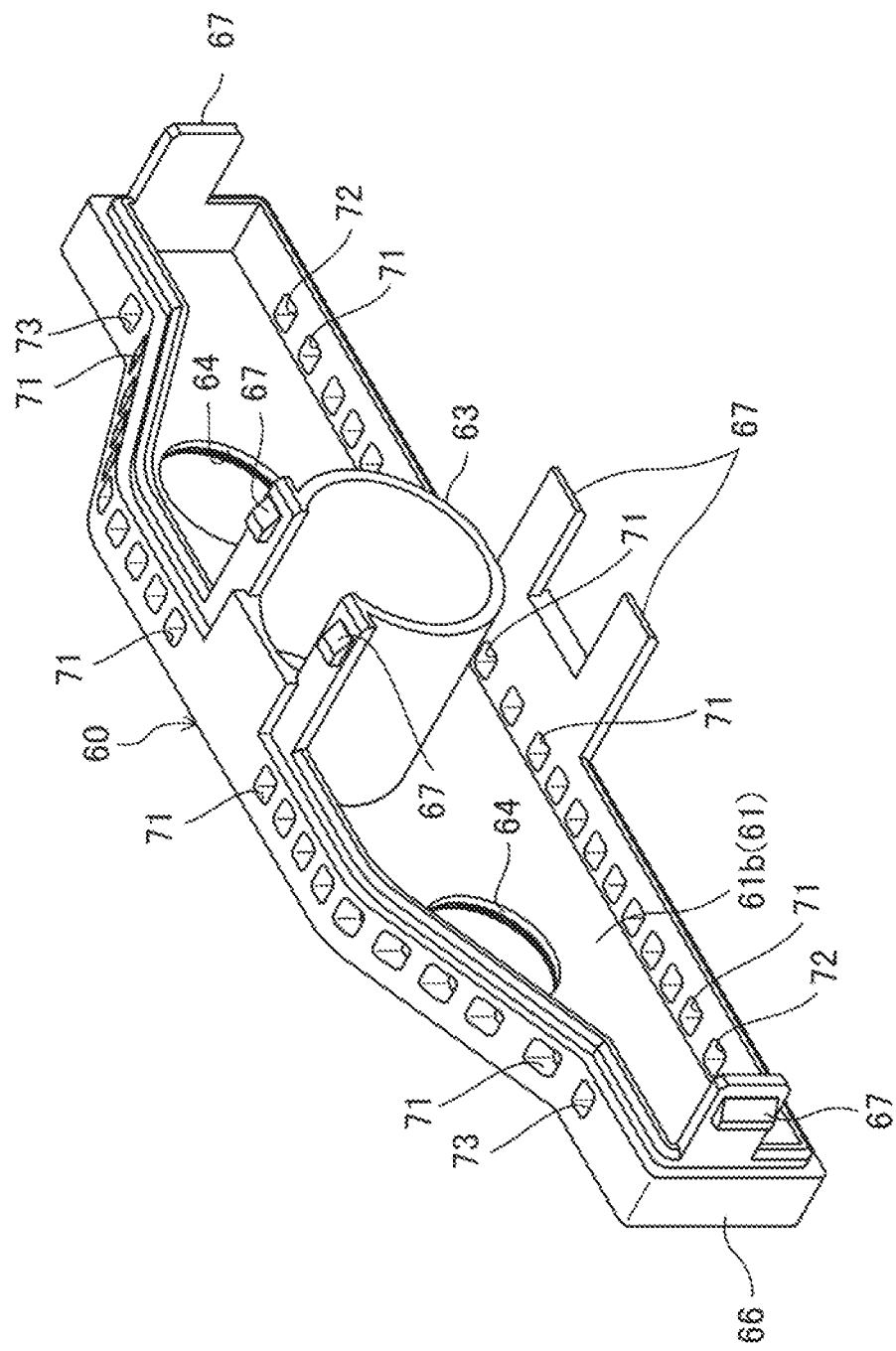
FIG. 10 is a perspective view of a cover member, viewed from the rear side.
Figure 11:
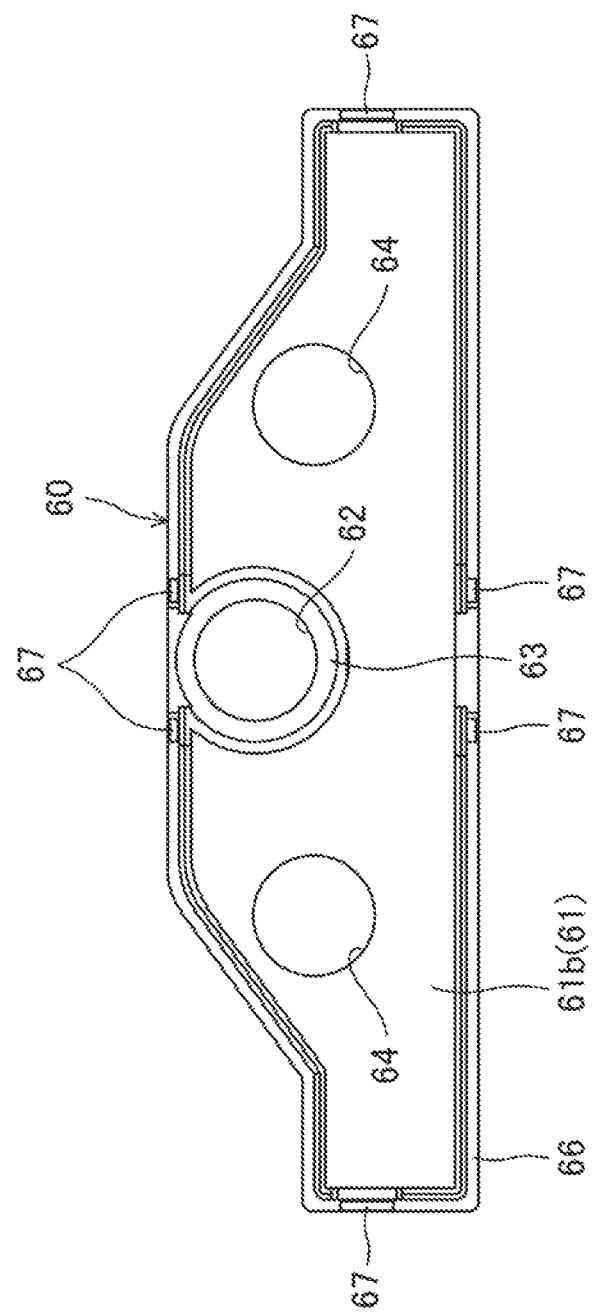
FIG. 11 is a rear view of the cover member.

As illustrated in FIG. 11, front surface 61 has, in a center of front surface 61 when viewed in the left-right direction, lens through-hole 62 penetrating through front surface 61 in the front-rear direction and having a circular shape. Lens through-hole 62 is positioned at a location facing lens portion 14 (lens surface 14a) of camera unit 11 accommodated in housing 3. In addition, as also illustrated in FIG. 10, lens accommodation portion 63 is provided at a location corresponding to a periphery of lens through-hole 62. Lens accommodation portion 63 protrudes, in a substantially cylindrical shape, rearward from a center of back surface 61b of front surface 61 when viewed in the left-right direction, and is formed integrally with front surface 61. Lens accommodation portion 63 is configured such that lens portion 14 of camera unit 11 is accommodated inside lens accommodation portion 63.

Light-transmitting holes 64 are respectively provided on left and right sides of lens accommodation portion 63. Light-transmitting holes 64 penetrate through front surface 61 in the front-rear direction, and have a circular shape. Light-transmitting holes 64 are arranged at locations being spaced from each other in the left-right direction and respectively facing LED elements 30 of LED unit 19 mounted in housing 3.

As illustrated in FIGS. 1 and 5, front surface 61 has surface 61a provided with light-transmitting portion 65 having a thin film shape. Light-transmitting portion 65 is made of, e.g., a sheet material through which light of a wavelength within an infrared area is allowed to pass, such as an acrylic resin. Light-transmitting portion 65 is fixed to front surface 61 such that light-transmitting portion 65 covers front sides of lens through-hole 62 and light-transmitting holes 64. Light-transmitting portion 65 allows illumination light having been emitted from LED elements 30 and having passed through light-transmitting holes 64 to pass through light-transmitting portion 65 so as to be directed toward the front side of imaging device 1.

In addition, as illustrated in FIGS. 10 and 11, cover member 60 has peripheral edge walls 66 extending rearward from peripheral edges of front surface 61. Peripheral edge walls 66 have claws 67 extending rearward from rear edges of peripheral edge walls 66. Cover member 60 can be attached to the front opening of housing 3 in a state where claws 67 are engaged with engagement holes 4b of bottom plate 4 and engagement holes 6a and 7b of upper lid 5, respectively.

Figure 12:
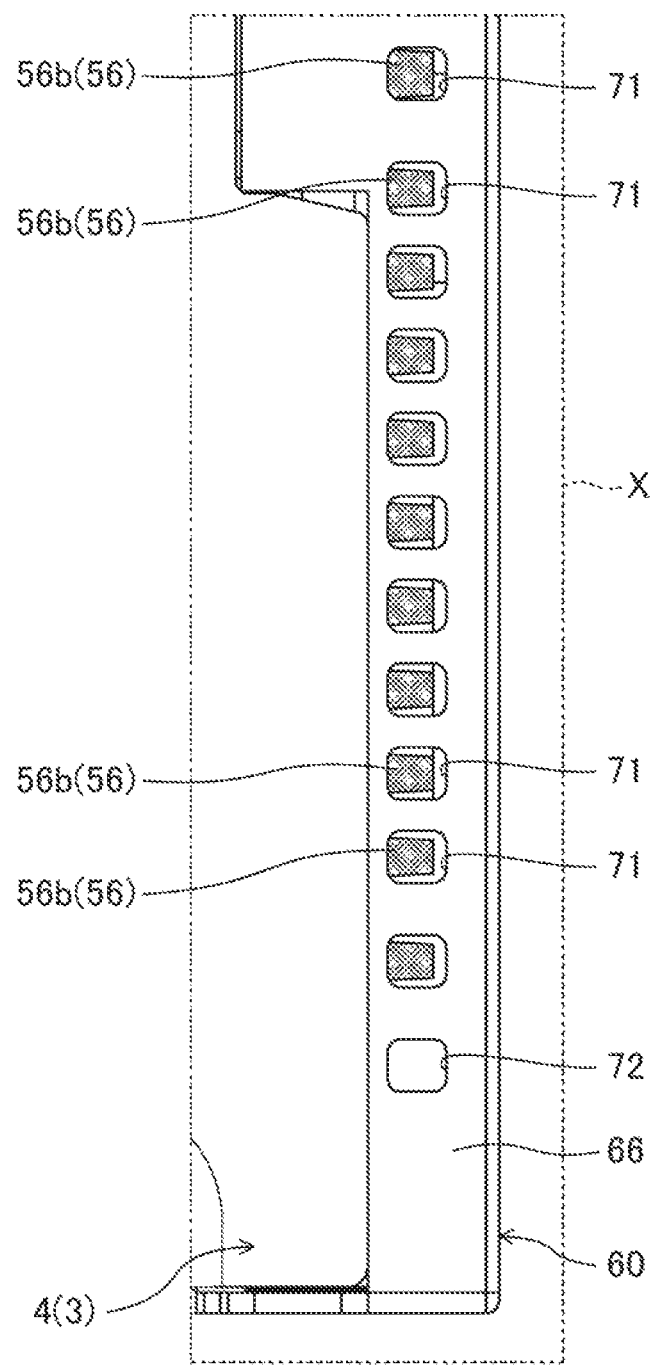
FIG. 12 is a partial enlarged view of a portion indicated by X in FIG. 3.
Figure 13:
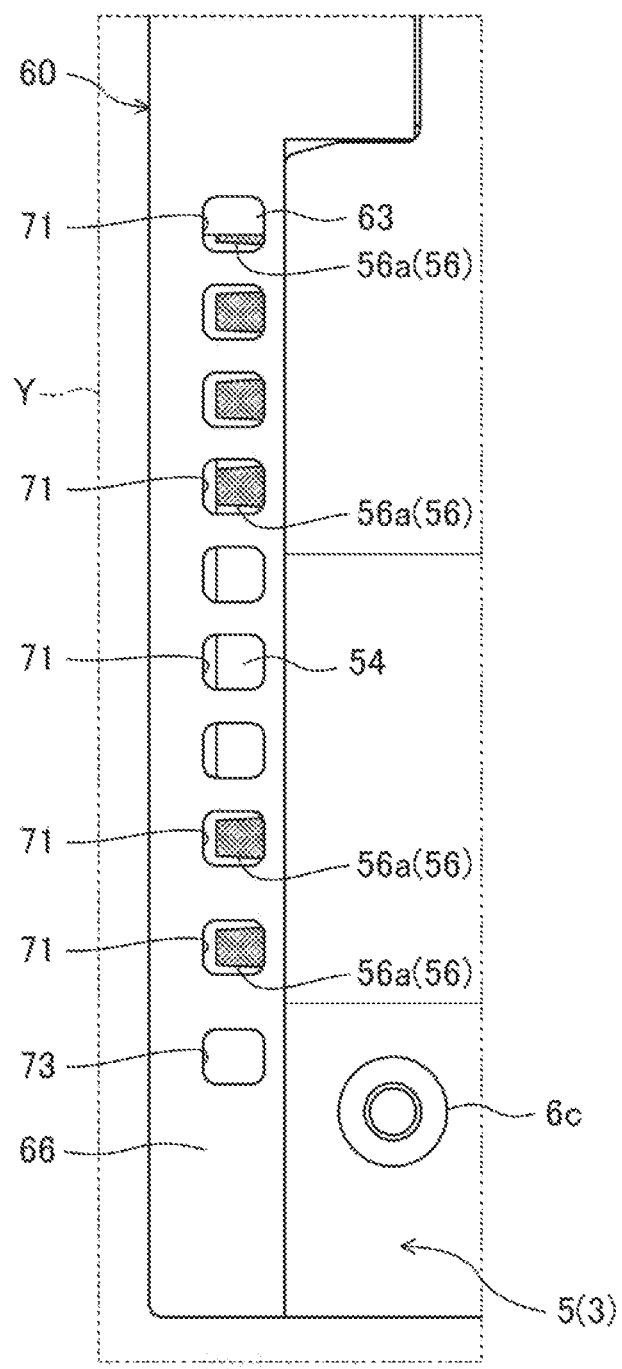
FIG. 13 is a partial enlarged view of a portion indicated by Y in FIG. 4.

Next, peripheral edge walls 66 have openings that are opened at locations spaced from each other in the left-right direction. The openings are formed to allow a space between heatsink 50 and cover member 60 to communicate with the outside. The following describes the openings with reference to FIGS. 12 to 14. Note that FIG. 12 is a partial enlarged view of a portion indicated by X in FIG. 3. Namely, FIG. 12 substantially illustrates lower halves of the openings shown in FIG. 3. Upper halves of the openings are substantially the same as those of FIG. 12 reversed upside down, and thus are not illustrated herein. Also, FIG. 13 is a partial enlarged view of a portion indicated by Y in FIG. 4. Namely, FIG. 13 substantially illustrates lower halves of the openings shown in FIG. 4. Upper halves of the openings are substantially the same as the configurations of FIG. 13 reversed upside down, and thus are not illustrated herein.

As illustrated in FIGS. 12 and 13, the openings include first openings 71 arranged at locations respectively facing upper ends 56a and lower ends 56b of fins 56. As illustrated also in FIG. 14, first openings 71 facing lower ends 56b of fins 56 serve as inflow ports through which air A that is to be naturally convected by fins 56 of heatsink 50 flows into the space between heatsink 50 and cover member 60. Meanwhile, first openings 71 facing upper ends 56a of fins 56 serve as outflow ports through which air A that is naturally convected flows out of the space between heatsink 50 and cover member 60.

As illustrated in FIG. 12, first openings 71 facing lower ends 56b of fins 56 are each opened to have an opening area including spaces on left and right sides of and in front of lower end 56b of a corresponding one of fins 56 in a bottom view. Meanwhile, as illustrated in FIG. 13, first openings 71 facing upper ends 56a of fins 56 are each opened to have an opening area including spaces on left and right sides of and in front of upper end 56a of a corresponding one of fins 56 in a plan view. Namely, first openings 71 are each opened to have an opening area including a peripheral portion of a position facing upper end 56a or lower end 56b of a corresponding one of fins 56.

Note that, in FIGS. 12 and 13, end surfaces of upper ends 56a and lower ends 56b of fins 56 (i.e., basal surfaces of the quadrangular prisms) are hatched with dots in order to illustrate upper ends 56a and lower ends 56b in a highlighted manner.

As illustrated in FIGS. 10 and 12, the openings include second openings 72 arranged at locations not facing lower ends 56b of fins 56. Namely, second openings 72 are provided on the inflow side from which air A (illustrated in FIG. 14) that is to be naturally convected by fins 56 of heatsink 50 flows into the space between heatsink 50 and cover member 60. Each of second openings 72 is formed between a corresponding one of peripheral edge walls 66 respectively located on left and right sides of cover member 60 and a corresponding one of fins 56 arranged at locations respectively facing these peripheral edge walls 66 in a bottom view.

In addition, as illustrated in FIGS. 10 and 13, the openings include third openings 73 arranged at locations not facing upper ends 56a of fins 56. Each of third openings 73 is formed between a corresponding one of peripheral edge walls 66 respectively located on the left and right sides of cover member 60 and a corresponding one of fins 56 arranged at locations respectively facing these peripheral edge walls 66 in a bottom view. More specifically, third openings 73 are formed at locations respectively facing second openings 72 in the top-bottom direction.

(Effects and Advantages of the Exemplary Embodiment)

As described above, in imaging device 1 according to the present exemplary embodiment, LED elements 30 (light-emitting elements) are mounted on surface 20a of LED substrate 20 (substrate), and are electrically connected to wiring pattern 22. Thus, heat generated in LED elements 30 due to electric power consumed by LED elements 30 when LED elements emit illumination light is transferred from LED elements 30 to surface 20a of LED substrate 20 (more specifically, to wiring pattern 22). Consequently, wiring pattern 22 formed on surface 20a of LED substrate 20 is apt to be heated to a high temperature. For surface 20a of LED substrate 20, heatsink 50 for dissipating heat of LED substrate 20 is arranged at a location in front of LED substrate 20. Specifically, rear surface 51b of base portion 51, through which illumination light from LED elements 30 is allowed to pass, is attached to face surface 20a of LED substrate 20 in a manner allowing heat transfer. With this, the heat on surface 20a of LED substrate 20 is more likely to be directly transferred to base portion 51 of heatsink 50. Heatsink 50 heated to a high temperature by the heat having been transferred thereto from surface 20a of LED substrate 20 via base portion 51 is cooled by air A that is naturally convected by fins 56. Namely, with heatsink 50, the heat on surface 20a of LED substrate 20 is dissipated not via LED substrate 20 but through fins 56. Specifically, the heat on surface 20a of LED substrate 20 is transferred from rear surface 51b (heat transfer surface) of base portion 51 to fins 56, which are provided on front surface 51a (heat dissipating surface) of base portion 51, so that the heat is dissipated through fins 56. Consequently, imaging device 1 according to the present exemplary embodiment can efficiently dissipate heat of LED substrate 20 caused by LED elements 30, thereby achieving a highly reliable operation environment even when LED substrate 20 is heated to a high temperature.

In addition, in front of heatsink 50, cover member 60 through which illumination light from LED elements 30 is allowed to pass is provided to cover fins 56. This can make heatsink 50 invisible from the outside of imaging device 1, thereby preventing impairment of appearance of imaging device 1. Cover member 60 has front surface 61 and peripheral edge walls 66. Peripheral edge walls 66 have the openings which are arranged at locations spaced from each other and through which the space between heatsink 50 and cover member 60 communicates with the outside. Accordingly, air A that is to be naturally convected by fins 56 of heatsink 50 can be taken at least into imaging device 1 through the openings. That is, the openings facilitate occurrence of natural convection. Consequently, with imaging device 1, it is possible to efficiently dissipate the heat of LED substrate 20.

In addition, the openings include paired first openings 71 positioned at locations respectively facing upper end 56a and lower end 56b (opposed ends) of a corresponding one of fins 56. One of paired first openings 71 serves as the inflow port through which air A that is to be naturally convected by fins 56 of heatsink 50 flows into the space between heatsink 50 and cover member 60, whereas another one of paired first openings 71 serves as the outflow port through which air A that is naturally convected flows out of the space between heatsink 50 and cover member 60. This makes it possible to cause air A that is to be naturally convected by fins 56 of heatsink 50 to flow from first openings 71 serving as the inflow ports toward fins 56 and then flow from upper ends 56a of fins 56 toward first openings 71 serving as outflow ports so that air A flows to the outside. Namely, since first openings 71 serving as the inflow ports and the outflow ports are arranged at locations respectively facing upper ends 56a and lower ends 56b of fins 56, naturally-convected air A can smoothly flow along a longitudinal direction of surfaces of fins 56. Consequently, with imaging device 1, it is possible to efficiently dissipate the heat of LED substrate 20.

In addition, first openings 71 are each opened to have an opening area including a peripheral portion of a position facing upper end 56a or lower end 56b of a corresponding one of fins 56. Consequently, air A that is to be naturally convected from first openings 71 serving as the inflow ports toward the position in the periphery of fins 56 can be easily taken. Also, air A that is naturally convected at the position in the periphery of fins 56 can easily flow to the outside through first openings 71 serving as the outflow ports. As a result, air A that is naturally convected smoothly flows along the longitudinal direction of the surfaces of fins 56. Consequently, with imaging device 1, it is possible to more efficiently dissipate the heat of LED substrate 20.

The openings include second openings 72 provided on the inflow side from which air A that is to be naturally convected by fins 56 of heatsink 50 flows into the space between heatsink 50 and cover member 60, and second openings 72 are arranged at locations not facing upper ends 56a or lower ends 56b of fins 56. Second openings 72 facilitate a flow of the air into the space between heatsink 50 and cover member 60, which makes it possible to supply naturally-convected air A to fins 56 of heatsink 50.

In addition, the wiring pattern of LED substrate 20 includes planar patterns 22a, 22b, 22c, . . . formed in a plane shape extending along surface 20a of LED surface 20. With this, the heat on surface 20a of LED substrate 20, which is caused by LED elements 30, is more likely to be transferred to planar patterns 22a, 22b, 22c, . . . . In addition, areas where planar patterns 22a, 22b, 22c, . . . are in contact with rear surface 51b of base portion 51 of heatsink 50 are increased. With this, the heat on planar patterns 22a, 22b, 22c, . . . formed on surface 20a of LED substrate 20 is more likely to be transferred from rear surface 51b of base portion 51 to fins 56 provided on front surface 51a of base portion 51. Consequently, with imaging device 1, it is possible to more efficiently dissipate the heat of LED substrate 20.

Heat dissipating sheet 40 (heat conductor) formed in a thin film shape is interposed between surface 20a of LED substrate 20 and rear surface 51b of base portion 51 of heatsink 50. Since heat dissipating sheet 40 improves the heat-dissipating property of heatsink 50, it is possible to more efficiently dissipate the heat of LED substrate 20. In addition, according to the present exemplary embodiment, heat dissipating sheet 40 has an insulation property. Thus, thanks to heat dissipating sheet 40, it is possible to achieve an insulation property between LED substrate 20 and heatsink 50.

In addition, as illustrated in FIG. 14, heatsink 50 is arranged to cause, by fins 56, natural convection of air A along a direction opposite to a direction of gravitational force in order to dissipate the heat. Namely, an upward current of the air from lower ends 56b of fins 56 toward upper ends 56a of fins 56 is likely to occur. This results in a smooth flow of naturally-convected air A, thereby making it possible to improve the heat-dissipating property of heatsink 50.

[Variation of the Present Exemplary Embodiment]

Figure 15:
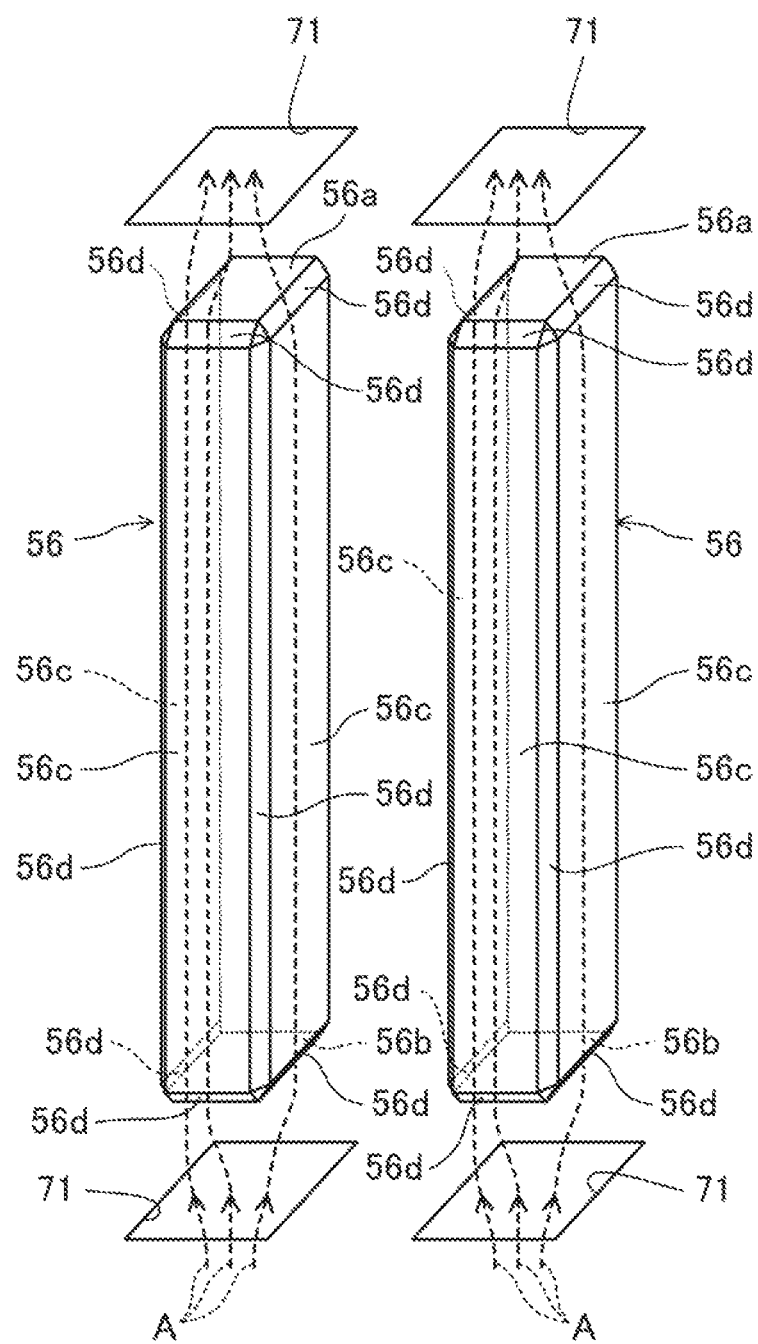
FIG. 15 is a view schematically illustrating, in a similar manner to FIG. 14, an arrangement of fins and first openings according to a variation of the exemplary embodiment of the present invention.

FIG. 15 illustrates a variation of imaging device 1 of the exemplary embodiment described above. A shape of each of fins 56 according to this variation is partially different from that of the exemplary embodiment described above. In the description below, parts that are the same as those in FIGS. 1 to 14 are given the same reference signs, and detailed description of such parts is omitted.

As illustrated in FIG. 15, each of fins 56 has chamfered portions 56d formed in corners corresponding to edges via which end faces of upper end 56a and lower end 56b (i.e., basal surfaces of a quadrangular prism) and corresponding side surfaces 56c are adjacent to each other. In addition, each of fins 56 has chamfered portions 56d formed in corners corresponding to edges via which side surfaces 56c are adjacent to each other. Consequently, each of fins 56 having chamfered portions 56d has a greater surface area than that of each of fins 56 shaped in a non-chamfered quadrangular prism. This increases a contact surface between fins 56 and air A that is naturally convected. Consequently, with imaging device 1 according to this variation, fins 56 of heatsink 50 achieve improved heat-dissipating property, which makes it possible to more efficiently dissipate heat of LED substrate 20.

Note that chamfered portions 56d may be formed only in the corners corresponding to the edges via which the end faces of upper end 56a and lower end 56b (i.e., the basal surfaces of the quadrangular prism) and corresponding side surfaces 56c are adjacent to each other. Alternatively, chamfered portions 56d may be formed only in the corners corresponding to the edges via which side surfaces 56c are adjacent to each other.

Other Exemplary Embodiments

The exemplary embodiment described above has dealt with imaging device 1 in which main substrate 10 is disposed inside housing 3. However, the present invention is not limited to this mode. Alternatively, main substrate 10 may be disposed outside housing 3.

In addition, the exemplary embodiment described above has dealt with imaging device 1 in which wiring patterns 22, 23 are formed in a plane shape. However, the present invention is not limited this mode. Alternatively, wiring patterns 22, 23 may be formed in a typical linear shape.

In addition, the exemplary embodiment described above has dealt with imaging device 1 in which each of second openings 72 is formed between a corresponding one of peripheral edge walls 66 respectively located on the left and right sides of cover member 60 and a corresponding one of fins 56 arranged at locations respectively facing these peripheral edge walls 66 in a bottom view. However, the present invention is not limited to this mode. Alternatively, for example, each of second openings 72 may be arranged between corresponding ones of fins 56. In short, each of second openings 72 only needs to be arranged at a location not facing lower ends 56b of fins 56.

In addition, the exemplary embodiment described above has dealt with imaging device 1 in which each of third openings 73 is formed between a corresponding one of peripheral edge walls 66 respectively located on the left and right sides of cover member 60 and a corresponding one of fins 56 arranged at locations respectively facing these peripheral edge walls 66 in a plan view. However, the present invention is not limited to this mode. Alternatively, for example, each of third openings 73 may be arranged between corresponding ones of fins 56. In short, each of third openings 73 only needs to be formed at a location facing a corresponding one of second openings 72 in a top-bottom direction.

In addition, the exemplary embodiment has dealt with imaging device 1 in which second openings 72 are arranged on the lower side in the top-bottom direction and third openings 73 are arranged on the upper side in the top-bottom direction. Alternatively, for example, imaging device 1 may be attached such that second openings 72 and third openings 73 are arranged upside down in the top-bottom direction. In such a configuration, a positional relation between second openings 72 and third openings 73 is reversed.

In addition, the exemplary embodiment described above has dealt with imaging device 1 in which the light-transmitting portion is made of heat dissipating sheet 40 having a thin film shape. However, the present invention is not limited this mode. Alternatively, for example, a light-transmitting portion made of a heat-conductive grease may be interposed between surface 20*a* of LED substrate 20 and rear surface 51*b* of heatsink 50. Further alternatively, no light-transmitting portion may be interposed between surface 20*a* of LED substrate 20 and rear surface 51*b* of heatsink 50.

In addition, the exemplary embodiment described above has dealt with imaging device 1 in which first openings 71 facing upper ends 56*a* of fins 56 are each opened to have an opening area including spaces on the left and right sides of and in front of upper end 56*a* of a corresponding one of fins 56 in a plan view. However, the present invention is not limited this mode. Alternatively, for example, the opening area of each of first openings 71 may include only either of the spaces on the left and right sides of upper end 56*a* of the corresponding one of fins 56. Further alternatively, the opening area of each of first openings 71 may include only the space in front of upper end 56*a* of the corresponding one of fins 56. This also applies to first openings 71 facing lower ends 56*b* of fins 56. In short, each of first openings 71 may be opened to have an opening area including a peripheral portion of a position facing upper end 56*a* or lower end 56*b* of a corresponding one of fins 56.

In addition, the exemplary embodiment described above has dealt with imaging device 1 in which air A is naturally convected by fins 56. However, the present invention is not limited to this configuration. Alternatively, imaging device 1 may be configured to cause air A to flow to the openings from the outside. Also in this configuration, air A flows along the longitudinal direction of the surfaces of fins 56. Thus, it is possible to achieve an adequate heat-dissipating effect.

In addition, the exemplary embodiment described above has dealt with imaging device 1 for monitoring a state of a passenger sitting on a seat of an automobile. However, use of the present invention is not limited to this. The present invention is applicable to all imaging devices integrally including a light-emitting element.

The exemplary embodiments of the present invention have been described above. However, the present invention is not limited to the exemplary embodiments above. The exemplary embodiments may be altered in various ways within the scope of the invention.

INDUSTRIAL APPLICABILITY

The present invention is industrially applicable as an imaging device that is installed on a steering column of an automobile and is configured to monitor a state of a passenger sitting on a seat of the automobile, for example.

REFERENCE MARKS IN THE DRAWINGS

1: imaging device
2: imaging unit
3: housing
4: bottom plate
4*a*: screw insertion hole
4*b*: engagement hole
5: upper lid
6: top board
6*a*: engagement hole
6*b*: screw tightening portion
6*c*: screw tightening portion
7: side wall
7*a*: screw tightening portion
7*b*: engagement hole
8: camera accommodation portion
8*a*: screw tightening portion
10: main substrate
10*a*: screw insertion hole
11: camera unit
12: unit body
13: attachment portion
13*a*: screw insertion hole
14: lens portion
14*a*: lens surface
15: camera substrate
16: flat cable
19: LED unit
20: LED substrate
20*a*: surface
20*b*: back surface
20*c*: screw insertion hole
20*d*: hole
21: recessed portion
22, 23: wiring pattern
22*a*, 23*a*: anode planar pattern
22*b*, 23*b*: cathode planar pattern
22*c*, 23*c*: ground planar pattern
24: through-hole
25: land
30: LED element
32: connection portion
40: heat dissipating sheet
40*a*: screw insertion hole
40*b*: hole
41: recessed portion
42: insertion hole
50: heatsink
51: base portion
51*a*: front surface
51*b*: rear surface
51*c*: screw tightening portion
51*c*: screw tightening portion
51*d*: positioning projection
52: recessed portion
53: insertion hole 54: shielding portion
55: attachment portion
55a: screw insertion hole
56: fin
56a: upper end
56b: lower end
56c: side surface
56d: chamfered portion
60: cover member
61: front surface
61a: surface
61b: back surface
62: lens through-hole
63: lens accommodation portion
64: light-transmitting hole
65: light-transmitting portion
66: peripheral edge wall
67: claw
71: first opening
72: second opening
73: third opening

The invention claimed is:

1. An imaging device having an imaging unit comprising:
a substrate having a surface on which a predetermined wiring pattern is formed;
a light-emitting element mounted on the surface of the substrate and electrically connected to the predetermined wiring pattern, the light-emitting element being configured to emit illumination light in an imaging direction of the imaging unit; and
a heatsink arranged to face the surface of the substrate on which surface the light-emitting element is mounted, the heatsink being configured to dissipate heat of the substrate,
the heatsink including
a base portion attached in a manner allowing heat transfer in which a heat transfer surface of the base portion faces the surface of the substrate, the base portion allowing the illumination light from the light-emitting element to pass through the base portion and
fins integrally protruding from a heat dissipating surface, being spaced from each other, and being cooled by air;
wherein the imaging device further comprising:
a cover member provided to cover the fins on the heat dissipating surface of the heatsink, the cover member allowing the illumination light from the light-emitting element to pass through the cover member, wherein
the cover member includes
a front surface positioned at a location facing the heat dissipating surface of the heatsink and being spaced from the fins and
a peripheral edge wall extending rearward from a peripheral edge of the front surface and
the peripheral edge wall has openings which are arranged to be spaced from each other and through which a space between the heatsink and the cover member communicates with outside.

2. The imaging device according to claim 1, wherein
the openings include paired first openings positioned at locations respectively facing opposed ends of a corresponding one of the fins, and
one of the paired first openings is an inflow port through which air that is to be naturally convected by the fins of the heatsink flows into the space between the heatsink and the cover member, and another one of the paired first openings is an outflow port through which the air that is naturally convected flows from the space between the heatsink and the cover member.

3. The imaging device according to claim 2, wherein
the paired first openings are opened to respectively have opening areas including peripheral portions of positions facing opposed ends of a corresponding one of the fins.

4. The imaging device according to claim 1, wherein
the openings include second openings provided on an inflow side of the peripheral edge wall from which air that is to be naturally convected by the fins flows into the space between the heatsink and the cover member, and
the second openings are arranged at locations not facing the opposed ends of the fins.

5. The imaging device according to claim 1, wherein
the predetermined wiring pattern on the substrate includes a planar pattern formed in a plane shape extending along the surface of the substrate.

6. The imaging device according to claim 1, wherein
a heat conductor formed in a thin film shape is interposed between the surface of the substrate and the heat transfer surface of the heatsink.

7. The imaging device according to claim 1, wherein
each of the fins has a substantially prismatic shape chamfered in at least either of edges via which basal surfaces and corresponding side surfaces of the fins are adjacent to each other and edges via which the side surfaces of the fins are adjacent to each other.

8. The imaging device according to claim 1, wherein
the heatsink is arranged to cause, by the fins, natural convection of air along a direction opposite to a direction of gravitational force to dissipate the heat.

* * * * *